United States Patent [19]

Kogure

[11] Patent Number: 5,319,596
[45] Date of Patent: Jun. 7, 1994

[54] SEMICONDUCTOR MEMORY DEVICE EMPLOYING MULTI-PORT RAMS

[75] Inventor: Kanari Kogure, Tokyo, Japan

[73] Assignee: NEC Corporation, Japan

[21] Appl. No.: 902,719

[22] Filed: Jun. 23, 1992

[30] Foreign Application Priority Data

Jun. 27, 1991 [JP] Japan .................................. 3-183667

[51] Int. Cl.$^5$ ........................ G11C 7/00; G11C 11/34; G06F 15/16
[52] U.S. Cl. ........................... 365/189.04; 365/189.03; 365/189.01; 365/230.05
[58] Field of Search .................................... 365/189.04

[56] References Cited

U.S. PATENT DOCUMENTS 4,616,310 10/1986 Dill et al. ...................... 365/189.04
4,893,279 1/1990 Rahman et al. ................ 365/189.04

FOREIGN PATENT DOCUMENTS 59-151371 8/1984 Japan .

OTHER PUBLICATIONS

"Reconfigurable single/dual port RAM system", IBM TDB, vol. 29, No. 4, Sep. 1986, pp. 1881-1882.

Primary Examiner—Eugene R. LaRoche
Assistant Examiner—Viet Q. Nguyen
Attorney, Agent, or Firm—Ostrolenk, Faber, Gerb & Soffen

[57] ABSTRACT

According to this invention, a semiconductor memory device includes N M-port RAMs (where each of M and N is a positive integer of not less than two), a data input terminal, $N \times (M-1)$ read address terminals, a write address terminal, and $N \times (M-1)$ data output terminals. The N M-port RAMs are operated in synchronization with a common clock signal. The data input terminal commonly inputs write data to data input terminals of the M-port RAMs. The $N \times (M-1)$ read address terminals independently input read addresses to first to (M-1)th port address terminals of the M-port RAMs. The write address terminal commonly inputs a write address to Mth port address terminals of the M-port RAMs. The $N \times (M-1)$ data output terminals independently output read data from data output terminals of the M-port RAMs.

6 Claims, 5 Drawing Sheets

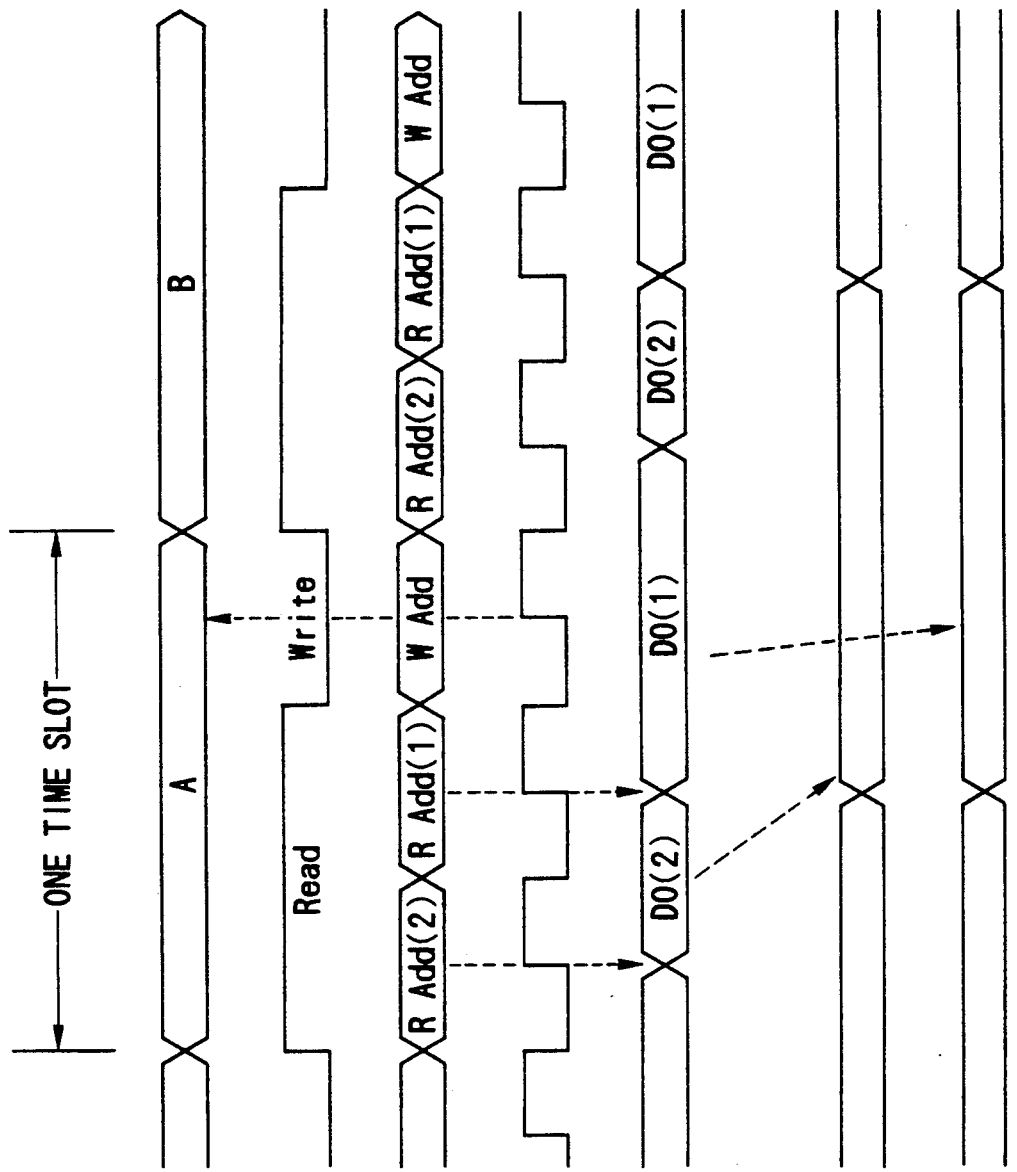

SEMICONDUCTOR MEMORY DEVICE EMPLOYING MULTI-PORT RAMS

BACKGROUND OF THE INVENTION

The present invention relates to a semiconductor memory device consisting of a synchronous RAM (Random Access Memory) which is used in a semiconductor memory device consisting of a synchronous RAM and, more particularly, is capable of simultaneously performing write access of the same data at an arbitrary address and read access of a plurality of data.

FIG. 4 is a block diagram showing a main part of a conventional semiconductor memory device consisting of a synchronous RAM.

The conventional semiconductor memory device includes a one-port RAM 49, a selector 48 for selectively inputting an address, a serial/parallel converter 50 for serial/parallel-converting an output from the RAM 49, a data input terminal 41 for inputting input data DI, a read/write terminal 42 for inputting an R/W (read/write) control signal R/W, a clock terminal 43 for inputting a clock signal CLK, a read address terminal 44 for inputting a read address RADD(N) where N is a positive integer of 2 or more, a read address terminal 45 for inputting a read address RADD(N−1), a write address terminal 46 for inputting a write address WADD, an address select terminal 47 for inputting an address select signal SEL, a data output terminal (N) 51 for outputting output data DO(N), a data output terminal (N−1) 52 for outputting output data DO(N−1), and a data output terminal (N−2) 53 for outputting output data DO(N−2).

An operation of the conventional semiconductor memory device will be described below with reference to operation timing charts shown in FIGS. 5A to 5G. Note that, for descriptive simplicity, FIGS. 5A to 5G show a case wherein a condition N=2 is satisfied.

As shown in FIG. 4, when data at N different addresses are to be simultaneously extracted by a one-port RAM within one time slot, the following operation is performed. That is, as shown in FIG. 5D, a clock signal CLK having a frequency of (N+1) times is input to the one-port RAM 49 within one time slot of input data in FIG. 5A, and even-numbered periods of the clock signal CLK are assigned to a read control signal as shown in FIG. 5B. As shown in FIG. 5C, N multi-addresses switched by the selector 48 are accessed, data output and controlled in a sequence [Read (N), Read (N−1),..., Write] as shown in FIG. 5E is serial/parallel-converted by the serial/parallel converter 50, and as shown in FIGS. 5F and 5G, output data DO(N), DO(N−1),... are distributively output. Input data A and B shown in FIG. 5A are written at the period of the last clock signal CLK within one time slot in accordance with the control signal of FIG. 5B.

As described above, when an arrangement uses the conventional one-port RAM shown in FIG. 4, and data at N different addresses are to be simultaneously extracted within one time slot, a clock signal having a frequency of (N+1) times must be input to the one-port RAM within one time slot. When the frequency of the clock signal is increased, the RAM may not be operated, or a high-performance RAM is required. Therefore, the yield of LSIs is disadvantageously decreased.

SUMMARY OF THE INVENTION

It is an object of the present invention to provide a semiconductor device capable of simultaneously performing write access of data at an arbitrary memory address and read access of a plurality of data without any increase in clock frequency.

It is another object of the present invention to provide a semiconductor memory device requiring no high-performance RAM.

In order to achieve the above objects, according to the present invention, there is provided a semiconductor memory device comprising N M-port RAMs (where each of M and N is a positive integer of not less than two) which are operated in synchronization with a common clock signal, a data input terminal for commonly inputting write data to data input terminals of the M-port RAMs, $N \times (M-1)$ read address terminals for independently inputting read addresses to first to $(M-1)$th port address terminals of the M-port RAMs, a write address terminal for commonly inputting a write address to Mth port address terminals of the M-port RAMs, and $N \times (M-1)$ data output terminals for independently outputting read data from data output terminals of the M-port RAMs.

BRIEF DESCRIPTION OF THE DRAWINGS

FIGS. 5A to 5G are timing charts for explaining an operation in FIG. 4.

DESCRIPTION OF THE PREFERRED EMBODIMENT

An embodiment of the present invention will be described below with reference to the accompanying drawings.

Figure 1:
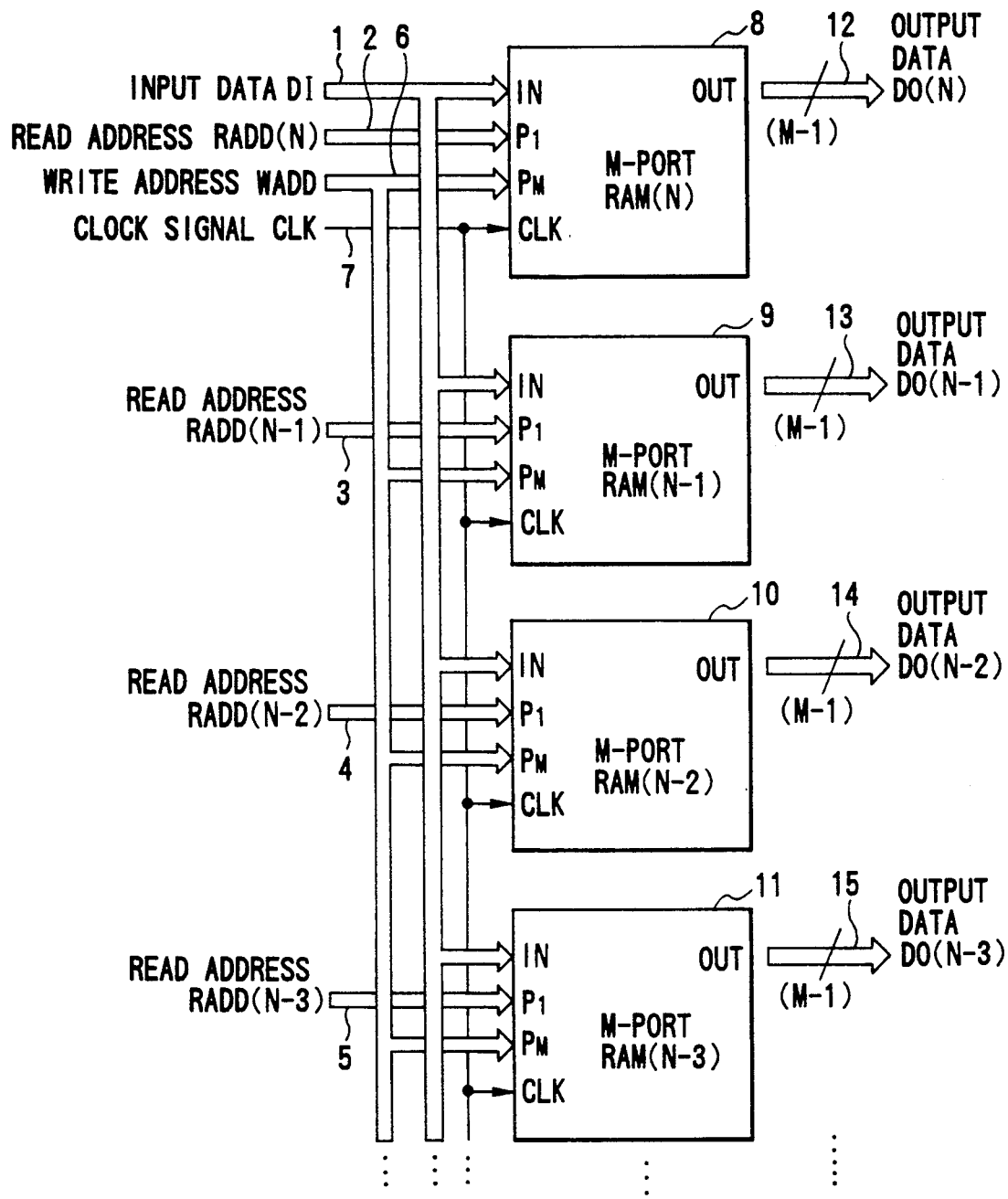
FIG. 1 is a block diagram showing a semiconductor memory device according to an embodiment of the present invention.

FIG. 1 shows a main part of the embodiment of the present invention and a basic arrangement of the present invention.

According to the first embodiment of the present invention, a semiconductor memory device includes a synchronous M-port RAM(N) 8 (where each of M and N is a positive integer of 2 or more), a synchronous M-port RAM(N−1) 9, a synchronous M-port RAM(N−2) 10, and a synchronous M-port RAM(N−3) 11 which are operated in synchronization with a clock signal. An input terminal IN of each of the M-port RAM(N−1) 8, RAM(N−2) 9, RAM(N−2) 10, and RAM(N−3) 11 is connected to a data input terminal 1 for inputting input data DI, and first port address terminals $P_1$ of the RAM(N), RAM(N−1), RAM(N−2), and RAM(N−3) 8, 9, 10, and 11 are connected to a read address terminal (N) 2 for inputting a read address RADD(N), a read address terminal (N−1) 3 for inputting a read address RADD(N−1), a read address terminal (N−2) 4 for inputting a read address RADD(N−2), and a read address terminal (N−3) 5 for inputting a read address RADD(N−3), respectively. Each Mth-port address terminal $P_m$ is connected to a write address terminal 6 for inputting a write address WADD, and each clock terminal CLK is connected to a clock terminal 7 for receiving a clock signal CLK. Output terminals OUT of the RAMs 8, 9, 10, and 11 are connected to a data output terminal (N) 12 for outputting output data DO(N), a data output terminal (N−1) 13 for outputting output data DO(N−1), a data output terminal (N−2) 14 for outputting output data DO(N−2), and a data output terminal (N−3) 15 for outputting output data DO(N−3), respectively.

Figure 2:
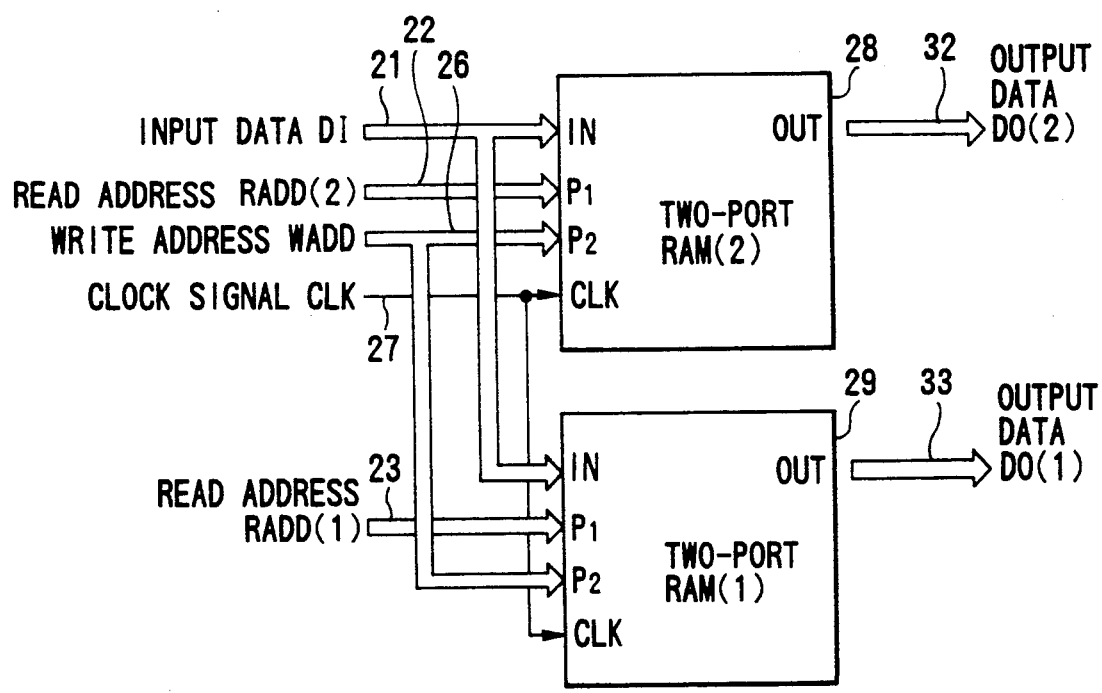
FIG. 2 is a block diagram showing a case wherein a condition N=M=2 is satisfied in FIG. 1.

FIG. 2 shows a case wherein a condition N=M=2 is satisfied in FIG. 1.

In this embodiment, a semiconductor memory device includes a two-port RAM(2) 28 and a two-port RAM(1) 29. Input terminals IN of the two-port RAM(2) 28 and RAM(1) 29 are commonly connected to a data input terminal 21 for receiving input data DI, and first port address terminals $P_1$ of the RAM(2) 28 and RAM(1) 29 are connected to a read address terminal (2) 22 for receiving a read address RADD(2) and a read address terminal (1) 23 for receiving a read address RADD(1), respectively. Second port address terminals $P_2$ of the RAM(2) 28 and RAM(1) 29 are commonly connected to a write address terminal 26 for receiving a write address WADD, each clock terminal OUT is connected to a clock terminal 27 for receiving a clock signal CLK, and output terminals OUT of the RAM(2) 28 and RAM(1) 29 are connected to a data output terminal (2) 32 for outputting output data DO(2) and a data output terminal (1) 33 for outputting output data DO(1), respectively.

An operation of this embodiment will be described below with reference to timing charts shown in FIGS. 3A to 3G.

Figure 3:
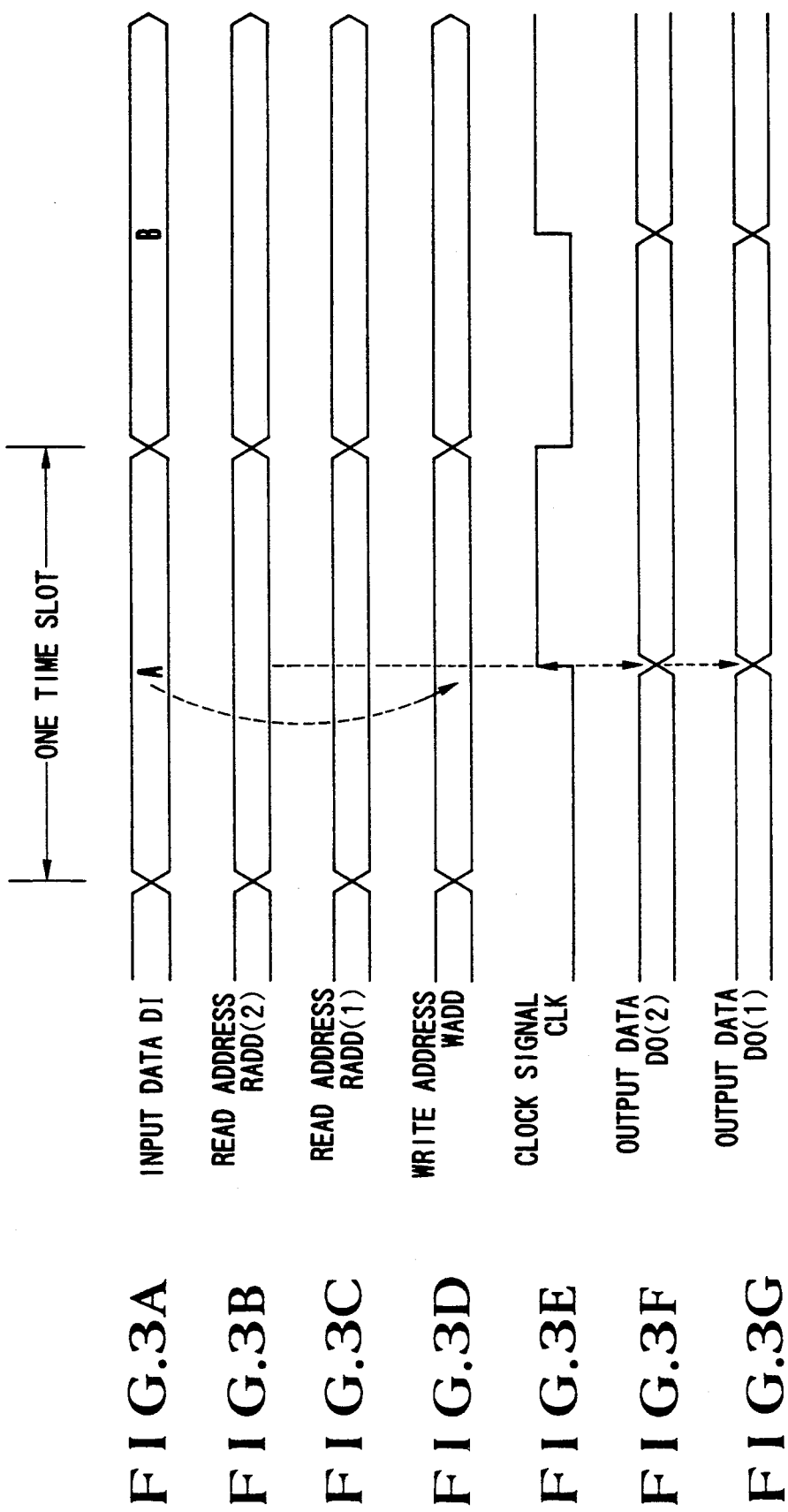
FIGS. 3A to 3G are timing charts for explaining an operation in FIG. 2.
Figure 4:
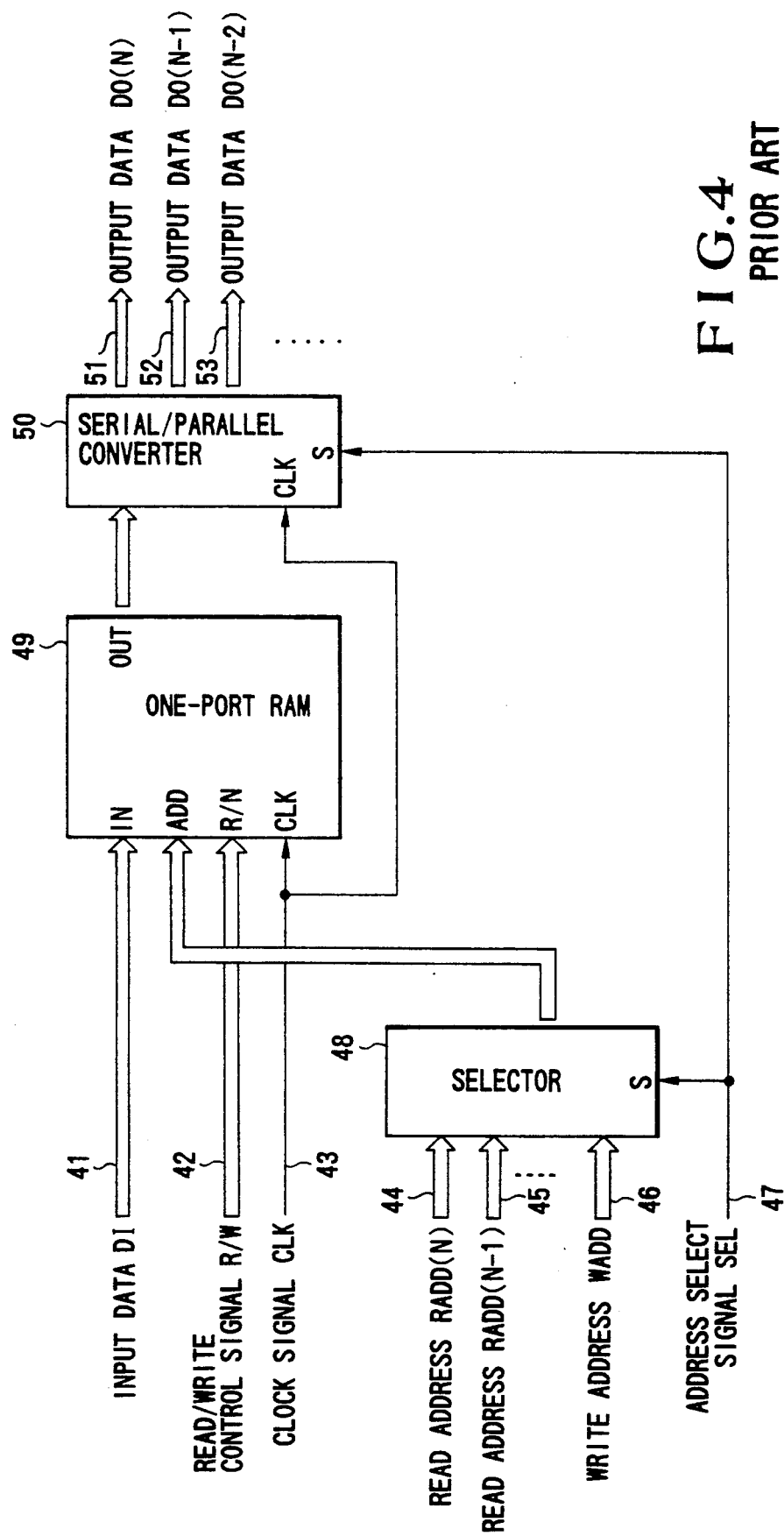
FIG. 4 is a block diagram showing a conventional semiconductor memory device.

In write access of data, the write address WADD is input from the write address terminal 26 to the two-port RAM(2) 28 and RAM(1) 29 as shown in FIG. 3D, and the same data DI which are represented as A and B in FIG. 3A are simultaneously written from the data input terminal 21 at the same address.

In read access of data, the read address RADD(2) is input from the read address terminal (2) 22 to the two-port RAM(2) 28 as shown in FIG. 3B, and the read address RADD(1) different from the read address RADD(2) is input from the read address terminal (1) 23 to the two-port RAM(1) 29 as shown in FIG. 3C. For this reason, the output data DO(2) is output from the two-port RAM(2) 28 to the data output terminal (2) 23 as shown in FIG. 3F, and the output data DO(1) different from the output data DO(2) is output from the two-port RAM(1) 29 to the data output terminal (1) 33 as shown in FIG. 3G.

That is, according to this embodiment, as shown in FIG. 3E, different data can be read at one clock timing within one time slot. In this case, the number of data which can be read at one clock timing is given as N×(M−1) in a general arrangement shown in FIG. 1.

In addition, when a condition N=M=2 is satisfied in FIG. 1, since a two-port RAM is used, write access and read access can be simultaneously performed.

In addition to the above embodiment, an arrangement in which three or more two-port RAMs are used is effective to simultaneously output a large number of data.

As described above, according to the present invention, N×(M−1) read address terminals and data output terminals which are independently arranged are connected to the first to (M−1)th port address terminals and the read data output terminals of N M-port RAMs which are operated in synchronization with a clock, and a write address terminal and a data input terminal are commonly connected to each of the Mth port address terminal and the Mth data input terminal. With the above arrangement, the following advantage can be obtained. N×(M−1) data can be read at one clock timing within one time slot, and at the same time, the same data can be written at an arbitrary address.

According to the present invention, a high-performance RAM is not required, and the yield of LSIs can be increased.

What is claimed is:

1. A semiconductor memory device comprising:
   N M-port RAMS (where each of M and N is a positive integer of not less than two) which are operated in phase in synchronization with a common clock signal and respectively have input terminals and output terminals for inputting and outputting data;
   a data input terminal for commonly inputting write data to data input terminals of said M-port RAMs;
   N×(M−1) read address terminals for independently inputting read addresses to the first to the (M−1)th port address terminals of said M-port RAMs;
   a write address terminal for commonly inputting a write address to Mth port address terminals to said M-port RAMS; and
   N×(M−1) data output terminals for independently outputting read data from the output terminals of said M-port RAMs.
   wherein within one time slot of the common clock signal, common write data is written into said M-port RAMS at the same time read data is read therefrom.

2. A device according to claim 1, wherein a condition M=2 is satisfied.

3. A device according to claim 1, wherein a condition N=M=2 is satisfied.

4. A semiconductor memory device comprising:
   N M-port RAMS (where each of M and N is a positive integer of not less than two) which are operated in phase in synchronization with a common clock signal and respectively have input terminals and output terminals for inputting and outputting data;
   a data input terminal for commonly inputting write data to data input terminals of said M-port RAMs;
   N×(M−1) read address terminals for independently inputting read addresses to the first to the (M−1)th port address terminals of said M-port RAMs;
   a write address terminal for commonly inputting a write address to Mth port address terminals to said M-port RAMS;
   N×(M−1) data output terminals for independently outputting read data from the output terminals of said M-port RAMs.
   wherein the clock signal has one clock period within one time slot.

5. A device according to claim 1, wherein said (M−1) read address terminals respectively input different read addressed to the (M−1)th port address terminals of said M-port RAM's to read different data from said M-port RAMs.

6. A device according to claim 1, wherein the data input terminal is directly connected to the respective input terminals of said M-port RAMs.

* * * * *